United States Patent
Miyata

(10) Patent No.: US 10,811,295 B2
(45) Date of Patent: Oct. 20, 2020

(54) POSITIONING METHOD

(71) Applicant: DISCO CORPORATION, Tokyo (JP)

(72) Inventor: Satoshi Miyata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 50 days.

(21) Appl. No.: 16/298,092

(22) Filed: Mar. 11, 2019

(65) Prior Publication Data

US 2019/0287836 A1 Sep. 19, 2019

(30) Foreign Application Priority Data

Mar. 13, 2018 (JP) ................ 2018-045290

(51) Int. Cl.
| | |
|---|---|
| *H01L 21/68* | (2006.01) |
| *H01L 21/78* | (2006.01) |
| *G06T 7/00* | (2017.01) |
| *G06T 7/11* | (2017.01) |
| *G01B 11/00* | (2006.01) |
| *B23K 26/00* | (2014.01) |
| *H01L 21/67* | (2006.01) |

(52) U.S. Cl.
CPC ........... *H01L 21/681* (2013.01); *B23K 26/00* (2013.01); *G01B 11/002* (2013.01); *G06T 7/0006* (2013.01); *G06T 7/11* (2017.01); *H01L 21/67092* (2013.01); *H01L 21/78* (2013.01); *G06T 2207/30148* (2013.01)

(58) Field of Classification Search
CPC .......... B23K 26/00; G06T 2207/10056; G06T 2207/30148; G06T 7/0006; G06T 7/11; G06T 7/75; H01L 21/67092; H01L 21/681; H01L 21/78; G01B 11/002
See application file for complete search history.

(56) References Cited

U.S. PATENT DOCUMENTS

| | | | | |
|---|---|---|---|---|
| 5,075,772 | A | * | 12/1991 | Gebel ................. G01C 7/04 348/135 |
| 2017/0057016 | A1 | * | 3/2017 | Finn .................. B23K 26/142 |
| 2019/0019044 | A1 | * | 1/2019 | Motohashi .......... G05D 1/0246 |
| 2019/0251373 | A1 | * | 8/2019 | Lee ..................... G06T 7/73 |

FOREIGN PATENT DOCUMENTS

JP 07321181 A 12/1995

* cited by examiner

*Primary Examiner* — Bobbak Safaipour

(74) *Attorney, Agent, or Firm* — Greer Burns & Crain Ltd.

(57) ABSTRACT

A positioning method includes an imaging step, a straight line storage step, a straight line registration step, and a positioning step. The imaging step captures an image of a region including a target or street on a workpiece. The straight line storage step detects and stores the coordinate positions of all predetermined straight lines in the region. The straight line registration step allows an operator to select a specific straight line in the target or on the street from all the straight lines and register the selected straight line. The positioning step positions a processing unit on the street in accordance with coordinate data concerning the straight line selected and registered in the straight line registration step.

4 Claims, 4 Drawing Sheets

POSITIONING METHOD

BACKGROUND OF THE INVENTION

Field of the Invention

The present invention relates to a positioning method for a workpiece in a processing apparatus.

Description of the Related Art

Cutting apparatuses (dicing saws), laser processing apparatuses, and other processing apparatuses for manufacturing, for example, semiconductor devices perform cutting and laser processing along streets arrayed on the surface of a wafer that is a workpiece. When such processing is to be performed, the wafer is positioned (subjected to alignment) with respect to processing means while the wafer is held on a holding table included in a processing apparatus. Wafer positioning is achieved by capturing an image of a target (e.g., a street or an alignment key pattern) on a wafer surface with imaging means and making positional adjustments based on the captured image of the target. When, for example, a cutting apparatus is used, the wafer is positioned before cutting work so that a cutting blade is positioned on the street (refer to Japanese Patent Laid-open No. Hei 7-321181).

For wafer positioning, θ adjustment needs to be made so that the direction of processing feed by the processing means coincides with the direction of the street. In a wafer positioning process (alignment process) that is manually performed by an operator of the processing apparatus, an image of the surface of the wafer is captured with the imaging means, a reference position is set for left and right targets to achieve detection and acquire positional information, and then θ adjustment is made. Further, when processing is to be performed along the street, street centering (center adjustment) is achieved so as to position the processing means at the widthwise center of the street.

SUMMARY OF THE INVENTION

In recent years, a touch-panel operation unit frequently used with the processing apparatus makes it possible to set the reference position for a target while viewing a captured target image displayed on a touch panel. However, the operation accuracy of the touch panel is limited. Therefore, even when the operator touches the displayed target image, it is difficult to precisely set the reference position. Therefore, when the touch-panel operation unit is used, the reference position needs to be set by moving it in increments of several micrometers with fine adjustment keys (cursor movement arrow keys, etc.) separately mounted, for example, on the touch panel. However, such fine adjustment is repeated to unduly increase the time required for positioning.

The present invention has been made in view of the above circumstances, and provides a positioning method that facilitates an operation for positioning a workpiece during alignment.

In accordance with an aspect of the present invention, there is provided a positioning method for positioning processing means with respect to a plurality of streets before holding a workpiece with a rotatable holding table and allowing the processing means to perform processing feed of the workpiece in an X-axis direction along the streets. The workpiece has a plurality of surface-mounted devices formed in a region divided by the streets arrayed in a first direction and in a second direction. The second direction is orthogonal to the first direction. The positioning method includes an imaging step, a straight line storage step, a straight line registration step, and a positioning step. The imaging step uses imaging means to capture an image of a region including an operator-selected target or street among the plurality of streets on the workpiece. The straight line storage step, which is performed after completion of the imaging step, performs image processing to detect and store coordinate positions of all predetermined straight lines formed on an upper surface of a device among the plurality of devices and/or the street in the region. The straight line registration step, which is performed after completion of the straight line storage step, allows the operator to select a specific straight line in the target or on the street from all the straight lines and register the selected straight line. The positioning step positions the processing means with respect to the street in accordance with coordinate data concerning the straight line selected and registered in the straight line registration step.

Preferably, the imaging step, the straight line storage step, and the straight line registration step include a first region imaging step, a first region straight line storage step, a first straight line registration step, a second region imaging step, a second region straight line storage step, and a second straight line registration step. The first region imaging step captures an image of a first region including a first target that is selected by the operator with the imaging means. The first region straight line storage step performs image processing to detect and store coordinate positions of all straight lines that are formed on the upper surface of the device and/or the street in the first region and have an allowable angular difference from an X-axis. The first straight line registration step, which is performed after completion of the first region straight line storage step, allows the operator to select a straight line in the first target from all the straight lines and register the selected straight line as a first straight line. The second region imaging step, which is performed after completion of the first straight line registration step, moves the imaging means by a predetermined distance L (mm) in a processing feed direction from the first region and captures an image of a second region including a second target identical with the first target. The second region straight line storage step performs image processing to detect and store coordinate positions of all straight lines that are formed on the upper surface of the device and/or the street in the second region and have an allowable angular difference from the X-axis. The second straight line registration step, which is performed after completion of the second region straight line storage step, allows the operator to select a straight line in the second target from all the straight lines and register the selected straight line as a second straight line. An orientation adjustment step is then performed after completion of the second straight line registration step in order to calculate an angular difference θ=arctan(ΔY/L) between the street and the processing feed direction from the difference ΔY between a Y-axis direction position of the first straight line and a Y-axis direction position of the second straight line and from the predetermined distance L, and rotate the holding table θ degrees until the orientation of the street is parallel to the processing feed direction. After completion of the orientation adjustment step, the positioning step for positioning the processing means with respect to the street is performed.

Preferably, the first straight line registration step and the second straight line registration step are performed so that the coordinate position of the straight line selected by the operator from all the straight lines in the first and second targets is relatively set as a reference position of the imaging means. As the reference position of the imaging means is automatically set to coincide with the coordinate position of the straight line selected by the operator, imaging personnel can easily find the position of the selected straight line. This makes it possible to prevent a wrong straight line from being selected.

When the positioning method according to an aspect of the present invention is applied to street centering, the imaging step captures an image of a region including the entire width in a Y-axis direction of the street extended in the X-axis direction, the straight line storage step performs image processing to detect and store the coordinate positions of all straight lines extended in the X-axis direction within the region imaged in the imaging step, and the straight line registration step allows the operator to select two straight lines indicative of opposing ends in the Y-axis direction of the street from all the straight lines registered in the straight line storage step, and register the selected two straight lines. Subsequently, the positioning step positions the processing means at an intermediate position in the Y-axis direction of the two straight lines selected and registered in the straight line registration step.

When the above-described positioning method is used, image processing is performed to detect the coordinate positions of all straight lines around an imaged target so that the operator simply has to select a straight line from all straight lines as a target for θ adjustment and street centering. This increases the throughput of alignment operations.

As described above, the positioning method according to an aspect of the present invention facilitates an operation for positioning a workpiece during alignment and thus provides improved productivity.

The above and other objects, features and advantages of the present invention, and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
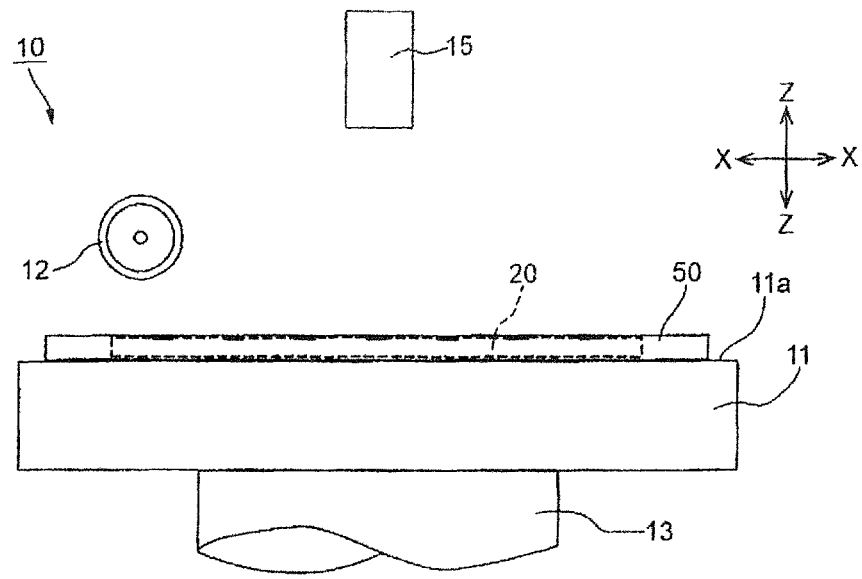
FIG. 1 is a side view illustrating a state where a wafer is held by a holding table of a cutting apparatus.
Figure 2:
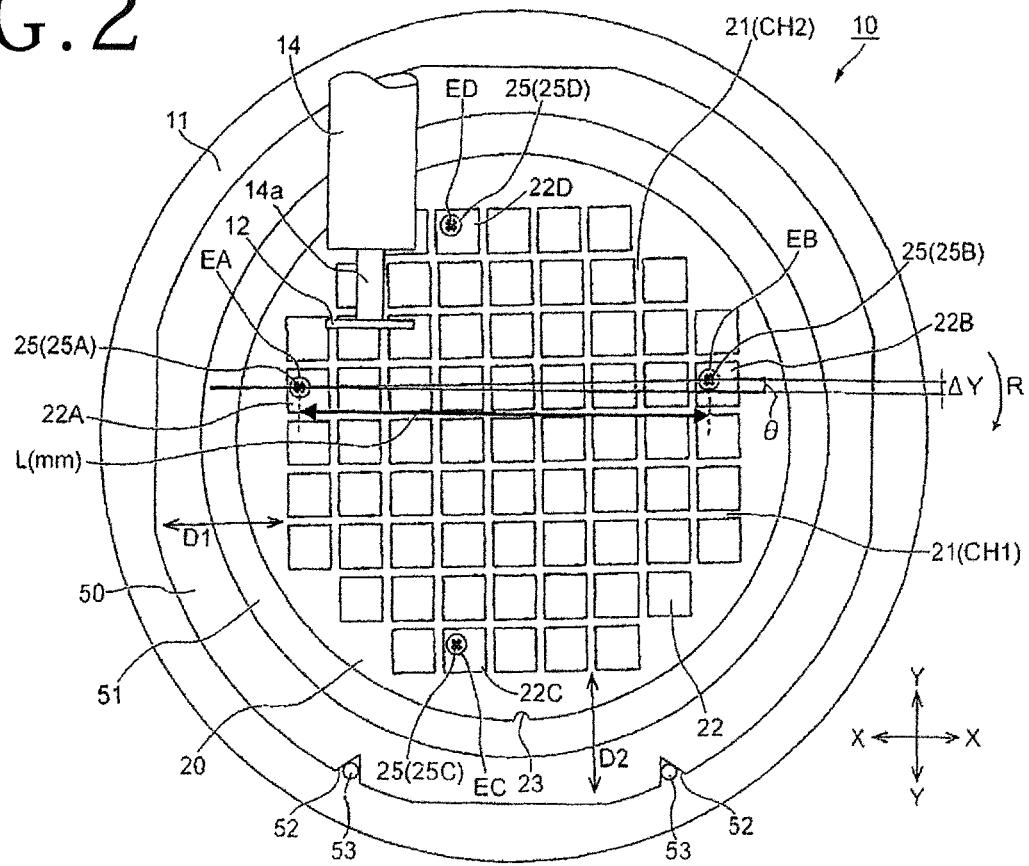
FIG. 2 is a top view illustrating a state where the wafer is held by the holding table of the cutting apparatus.
Figure 3:
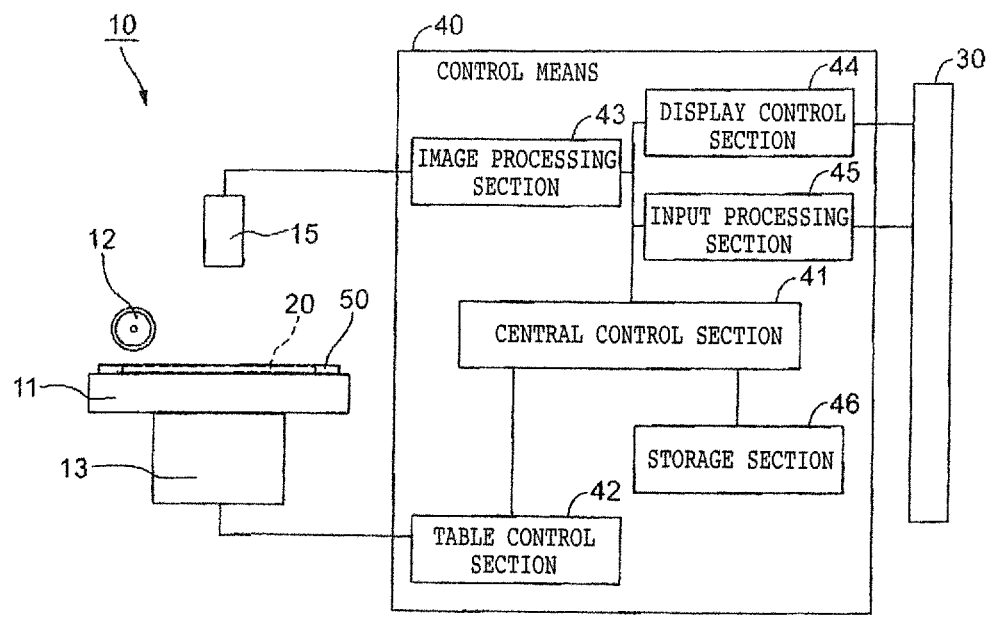
FIG. 3 is a block diagram conceptually illustrating a control system of the cutting apparatus.
Figure 4:
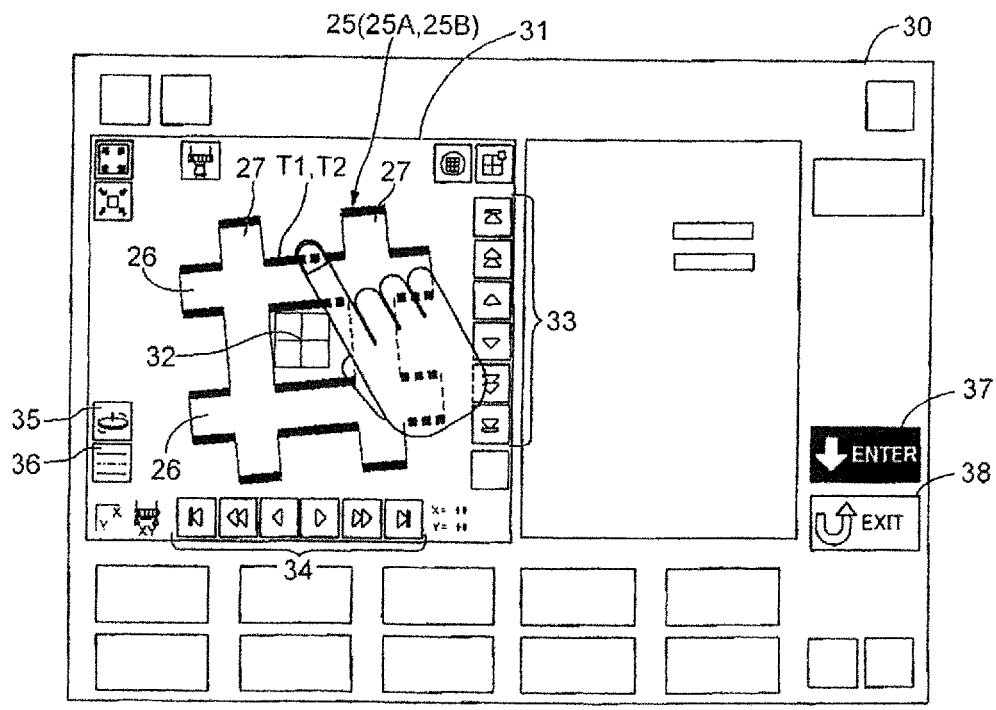
FIG. 4 is a front view of an operation panel indicating first and second straight line registration steps during θ adjustment for wafer positioning.
Figure 5:
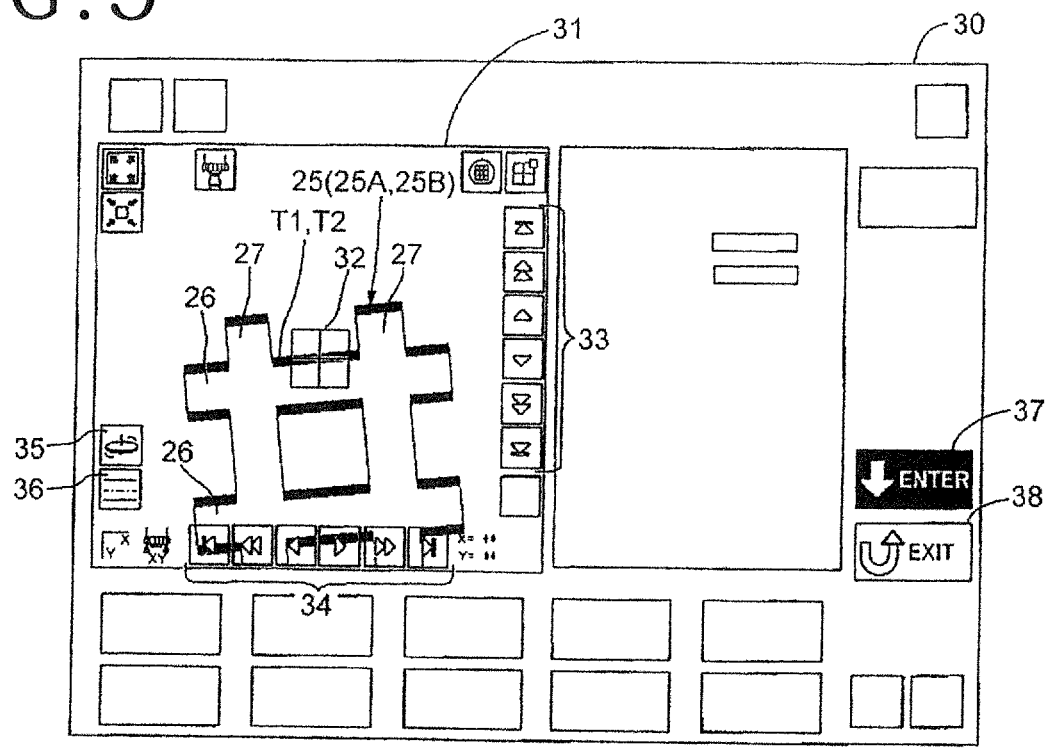
FIG. 5 is a front view of the operation panel in a state where the reference position of imaging means is set on a straight line that is selected in the first and second straight line registration steps.
Figure 6:
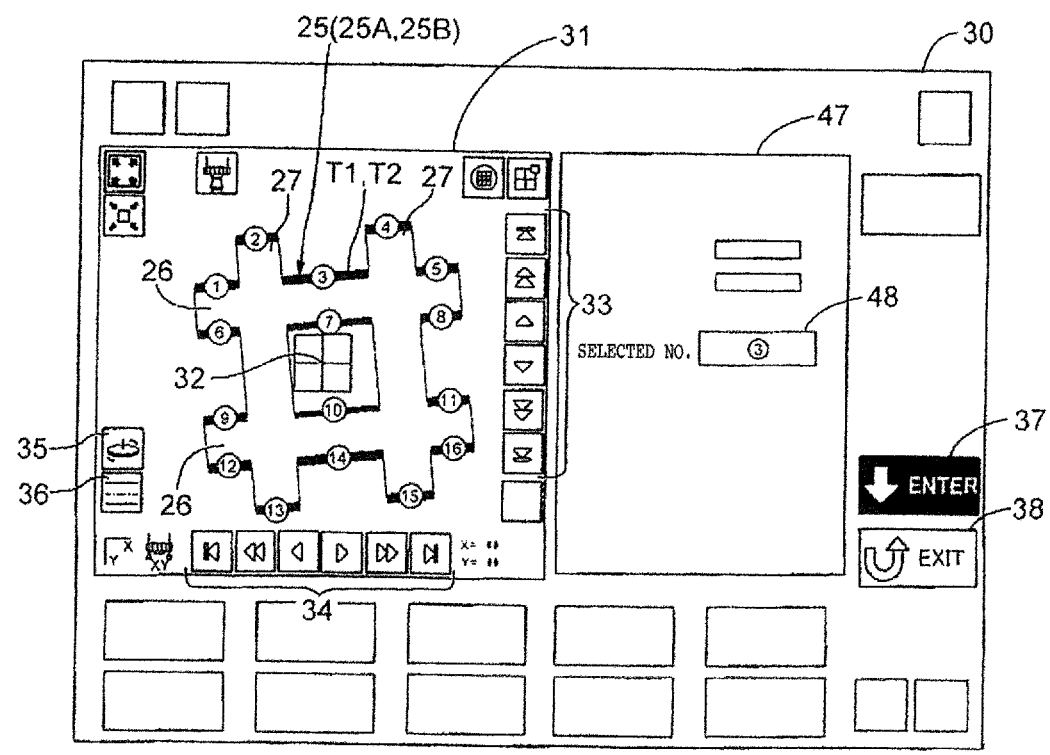
FIG. 6 is a front view of the operation panel indicating variations of the first and second straight line registration steps.
Figure 7:
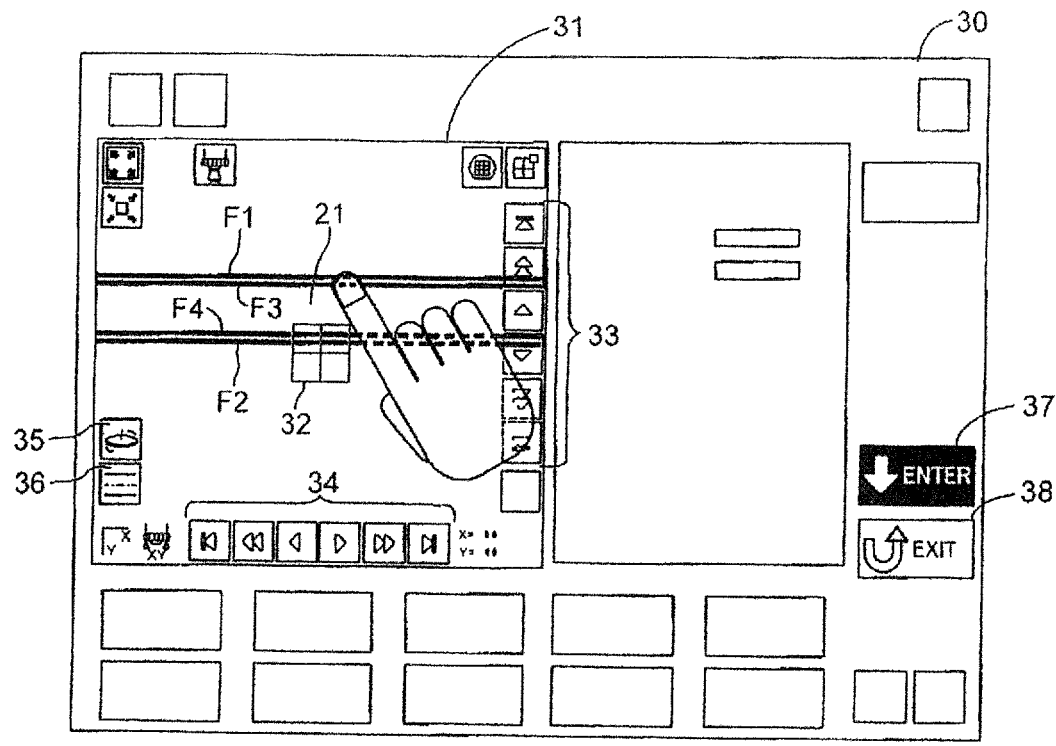
FIG. 7 is a front view of the operation panel indicating a straight line registration step in a case where street centering is performed for wafer positioning.
Figure 8:
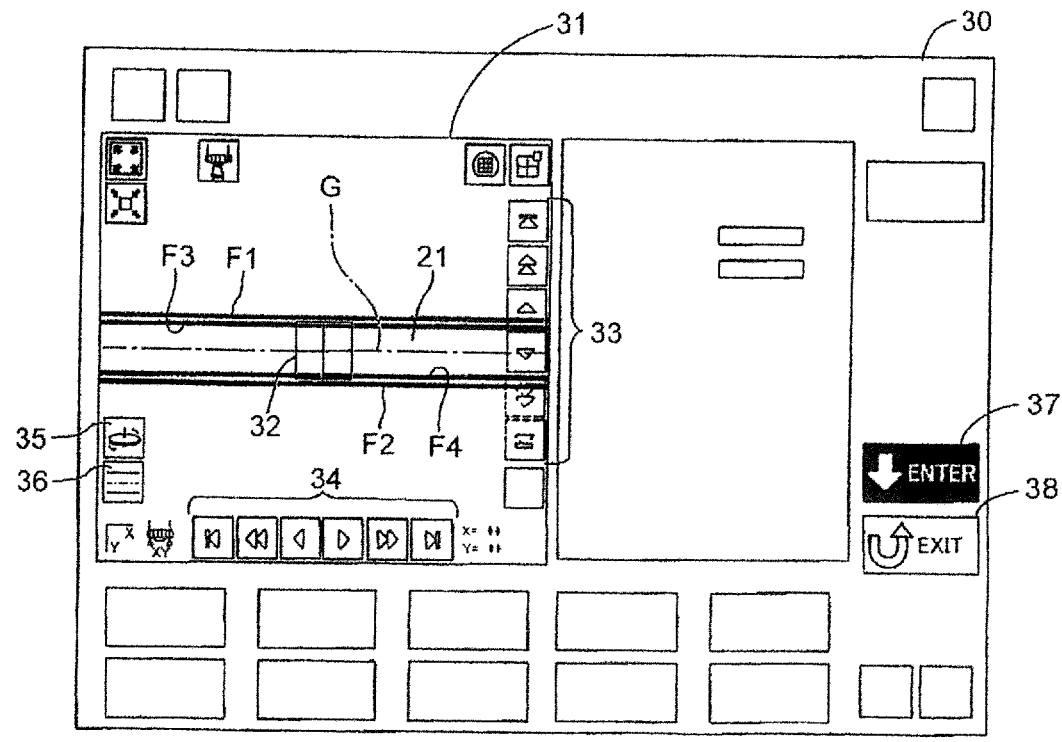
FIG. 8 is a front view of the operation panel in a state where the reference position of the imaging means is set on the centerline of a street in accordance with coordinate data concerning a straight line selected and registered in the straight line registration step.

Embodiments of the present invention will now be described with reference to the accompanying drawings. FIGS. 1 and 2 illustrate a state where a wafer is held by a holding table of a cutting apparatus according to an embodiment of the present invention. FIG. 3 conceptually illustrates a configuration of a control system of the cutting apparatus. FIGS. 4 to 6 illustrate a process that is performed when a positioning method according to an embodiment of the present invention is applied to θ adjustment of a wafer. FIGS. 7 and 8 illustrate a process that is performed when the positioning method according to an embodiment is applied to centering of a street on a wafer. The cutting apparatus used with the positioning method for a workpiece in accordance with the present embodiment is not limited to the configuration illustrated in FIGS. 1 to 3. Further, the following description assumes that the cutting apparatus is used as a processing apparatus. However, the processing apparatus is not limited to such a configuration. The following description is applicable to any processing apparatus as far as it is capable of processing a workpiece along a street.

As illustrated in FIG. 2, a wafer 20 that is a workpiece is conveyed to a cutting apparatus 10 while the wafer 20 is supported by the inside of an annular frame 50 through a dicing tape 51 attached to the rear surface of the wafer 20. When the wafer 20 is supported by the frame 50 through the dicing tape 51, the resulting combination is hereinafter referred to as the wafer unit.

As illustrated in FIGS. 1 and 2, the cutting apparatus 10 includes a holding table 11 and a cutting blade 12. The holding table 11 holds the wafer unit. The cutting blade 12 is processing means cutting the wafer 20 held on the holding table 11. The holding table 11 is shaped like a disc. The upper surface of the holding table 11 is formed as a retention surface 11a for holding the wafer unit. The retention surface 11a is connected to a suction source (not depicted) through a flow path. When the suction source is driven, the wafer unit is attracted and held by the retention surface 11a. A θ table 13 enables the holding table 11 to axially rotate in a Z-axis direction (vertical direction) orthogonal to the retention surface 11a.

The holding table 11 and the cutting blade 12 are capable of relatively moving in two orthogonal directions (X-axis and Y-axis directions) parallel to the retention surface 11a through a drive mechanism (not depicted). Further, the cutting blade 12 is capable of moving in the Z-axis direction with respect to the holding table 11. The configuration of the drive mechanism is not specifically limited. However, the drive mechanism is capable, for example, of supporting the holding table 11 and the θ table 13 on an X-axis table movable in an X-axis direction, and supporting the cutting blade 12 through a Y-axis slider movable in the Y-axis direction and a Z-axis slider movable in the Z-axis direction. The X-axis direction is a processing feed direction for cutting work by the cutting blade 12. As illustrated in FIG. 2, the cutting blade 12 is rotatably supported through a rotation shaft 14a with respect to a spindle housing 14. The rotation axial center of the rotation shaft 14a is extended in the Y-axis direction.

As illustrated in FIG. 2, a plurality of streets 21 are formed and arrayed in a lattice on a surface of the wafer 20.

A device 22 is formed in each of a plurality of regions divided by crossing streets 21. The streets 21 include a plurality of parallel first channels CH1 and a plurality of parallel second channels CH2. A first direction D1 (see FIG. 2) in which the first channels CH1 are extended and a second direction D2 (see FIG. 2) in which the second channels CH2 are extended are orthogonal to each other. The wafer 20 is shaped like a disc, and a notch 23 is formed on its outer circumference as an index indicative of crystal orientation.

As illustrated in FIG. 2, a target 25 serving as a reference for later-described θ adjustment of the wafer 20 exists inside each device 22 when the wafer 20 is viewed from above. The target 25 is a commonly shaped portion existing at a common position of each device 22. FIG. 2 depicts only four targets (a first target 25A, a second target 25B, a first target 25C, and a second target 25D) that are used for θ adjustment of the wafer 20.

The target 25 is a portion, for example, of a circuit formed within the limits of a device 22 that includes linear portions parallel to the first channels CH1 and the second channels CH2. As illustrated in FIGS. 4 and 6, the target 25 according to the present embodiment is shaped like a grid, or more specifically, formed by causing a pair of parallel bar-shaped portions 26 extended in the first direction D1 and a pair of parallel bar-shaped portions 27 extended in the second direction D2 to cross each other in an orthogonal manner. Edges of the bar-shaped portions 26 and bar-shaped portions 27 each include a linear portion (marked by a thick line in FIGS. 4 and 6) parallel to the first channels CH1 and a linear portion (marked by a thin line in FIGS. 4 and 6) parallel to the second channels CH2. The outline of the target 25 depicted in FIGS. 4 and 6 is marked by a thick line or a thin line for descriptive purposes in order to facilitate the differentiation between the linear portions extended in two different directions. In reality, the edges of the target 25 are not shaped like the thick line or thin line in FIGS. 4 and 6.

As illustrated in FIG. 2, two cut-outs 52 are formed in the outer circumference of the annular frame 50 surrounding the wafer 20. The holding table 11 has a plurality of positioning pins 53 that protrude upward from the retention surface 11a. The wafer unit on the holding table 11 can be positioned by fitting the positioning pins 53 into the cut-outs 52.

As illustrated in FIG. 1, the cutting apparatus 10 includes imaging means 15 disposed above the holding table 11. The imaging means 15 includes a camera that is capable of capturing an image at a low magnification (macro) and at a high magnification (micro). At a low magnification, the imaging means 15 captures an image of a relatively large region of the surface of the wafer 20. At a high magnification, the imaging means 15 captures an image of the surface area of the wafer 20 that is projected after being enlarged at a predetermined magnification by a microscope. The imaging means 15 includes a charge coupled device (CCD) or other imaging device (not depicted) having a plurality of pixels. The imaging means 15 is capable of relatively moving in the X- and Y-axis directions with respect to the holding table 11.

A touch-panel operation panel 30 (see FIGS. 3 to 8) is mounted on the outer surface of the cutting apparatus 10. The operation panel 30 functions as input means inputting operating commands for driving the cutting apparatus 10 and as display means displaying, for example, inputted information and the progress of processing. As illustrated in FIGS. 4 to 8, an image captured by the imaging means 15 is displayed in an image display region 31 of the operation panel 30 during a later-described alignment process.

A reference mark 32 appears in the image display region 31. The reference mark 32 is formed of two straight lines extended in the X- and Y-axis directions, respectively, to cross each other, and of a square frame enclosing the two straight lines. The point of intersection between the two straight lines is positioned at the center of an imaging field of view provided by the imaging means 15. The reference mark 32 is displayed at the center of the imaging field of view no matter whether the imaging means 15 captures an image at a high magnification or at a low magnification.

A plurality of arrow keys 33 and a plurality of arrow keys 34 are displayed in peripheral regions within the image display region 31. The arrow keys 33 are used for cursor movement in the Y-axis direction (positional adjustment of the imaging means 15), and the arrow keys 34 are used for cursor movement in the X-axis direction (positional adjustment of the imaging means 15). When any of the arrow keys 33 and 34 is operated while an image captured by the imaging means 15 is displayed in the image display region 31, the imaging means 15 moves in the Y- or X-axis direction to change the position of an imaging target displayed in the image display region 31.

Further, a mode selection button 35 for later-described θ adjustment and a mode selection button 36 for later-described street centering are displayed in the image display region 31.

In the outside of the image display region 31 on the operation panel 30, an apply button 37 and a cancel button 38 are displayed. The apply button 37 applies, for example, an inputted operation or numerical value. The cancel button 38 cancels, for example, an inputted operation or numerical value.

The cutting apparatus 10 is controlled by control means 40 depicted in FIG. 3. The control means 40 includes, for example, a memory and a processor for operating each element of the cutting apparatus 10. FIG. 3 conceptually illustrates some functions of the control means 40 as functional blocks. More specifically, the control means 40 includes a central control section 41, a table control section 42, an image processing section 43, a display control section 44, an input processing section 45, and a storage section 46. The central control section 41 provides overall control of the cutting apparatus 10. The table control section 42 controls the operation of the holding table 11 (including the θ table 13). The image processing section 43 performs, for example, image processing upon receiving an inputted image signal concerning an image captured by the imaging means 15. The display control section 44 provides display control of the operation panel 30. The input processing section 45 performs, for example, reception processing on an operation input to the operation panel 30. The storage section 46 stores information concerning, for example, the later-described alignment process. The control means 40 is able to recognize and manage the position of an element in an image captured by the imaging means 15 as a coordinate position in the X- and Y-axis directions in the unit of a display pixel in the image display region 31.

The cutting apparatus 10 configured as described above performs cutting work along the streets 21 by using the cutting blade 12 in order to divide the wafer 20 into individual devices 22 (full-cut) or form a bottomed, half-cut groove between the devices 22. In the cutting apparatus 10, alignment is performed before the cutting work on the wafer 20 to position the cutting blade 12 at a cutting start position of a street 21.

In the alignment step, before the cutting blade 12 is positioned on a street 21, the wafer 20 is subjected to positioning (θ adjustment) in a rotation direction around a Z-axis so that the first direction D1 and the second direction D2 in which the streets 21 (first channels CH1 and second channels CH2) are extended are parallel to an X-axis representing the processing feed direction. More specifically, θ adjustment and positioning of the cutting blade 12 are performed with respect to the first channels CH1, θ adjustment and positioning of the cutting blade 12 are performed with respect to the second channels CH2, and then cutting work is performed with respect the first channels CH1 and the second channels CH2. The positioning method according to the present embodiment, which is described below, particularly provides improved operability and facilitates θ adjustment during the alignment step on the wafer 20, which is manually performed by the operator of the cutting apparatus 10.

First of all, θ adjustment concerning the first channels CH1 will be described. FIG. 2 illustrates an exemplary state where a coarsely positioned wafer 20 is held. The wafer unit is held in a state where its approximate position in the rotation direction is set with respect to the holding table 11 by fitting the positioning pins 53 into the cut-outs 52 in the frame 50. More specifically, the first direction D1 (the direction in which the first channels CH1 are extended) of the streets 21 is oriented approximately in the X-axis direction, and the second direction D2 (the direction in which the second channels CH2 are extended) of the streets 21 is oriented approximately in the Y-axis direction. However, due, for instance, to an error in the support provided through the dicing tape 51, the wafer 20 may be still erroneously positioned in the rotation direction with respect to the holding table 11. Therefore, subsequently to the coarse positioning, higher-accuracy θ adjustment is made by using the imaging means 15.

θ adjustment using the imaging means 15 is made in a stepwise manner at different imaging magnifications. First of all, an image of the wafer 20 is captured at a low magnification by the imaging means 15, and then θ adjustment is made with respect to a relatively large target such as a street 21 on the wafer 20 (this θ adjustment is hereinafter referred to as the θ adjustment in a low-magnification mode). Although not depicted, in the low-magnification mode, an image of a larger region of the wafer 20 than the target 25 whose enlarged image is depicted in FIGS. 4 to 6 is captured to display the captured object image in the image display region 31. The object image to be displayed in the image display region 31 should include, for example, the entire width of at least one first channel CH1.

While viewing the image captured at a low magnification and displayed in the image display region 31, the operator adjusts the relative position of the imaging means 15 with respect to the wafer 20 until the center of the reference mark 32 in the imaging field of view coincides with a predetermined first channel CH1. In this instance, the operator makes positional adjustments by operating the arrow keys 33 and 34 in the image display region 31. When the operator performs a first applying operation (e.g., turning on the apply button 37 on the operation panel 30) after completion of positioning, the control means 40 registers a coordinate position adjusted for the reference mark 32 in the storage section 46, and then moves the imaging means 15 a predetermined distance in the X-axis direction with respect to the wafer 20. The amount of movement in the X-axis direction can be stored beforehand in the storage section 46 as a default value.

After the movement in the X-axis direction, the imaging means 15 captures an image again at the low magnification, and the operator confirms a positional deviation in the Y-axis direction between the predetermined first channel CH1 and the reference mark 32. If any positional deviation exists in the Y-axis direction, the position of the imaging means 15 with respect to the wafer 20 is adjusted until the center of the reference mark 32 coincides with the predetermined first channel CH1. This adjustment is made by allowing the operator to operate the arrow keys 33 and 34 in the image display region 31. When positioning is completed, the operator performs a second applying operation (e.g., turning on the apply button 37 on the operation panel 30). The control means 40 stores the amount of deviation adjustment in the Y-axis direction in the storage section 46.

After the second applying operation, based on the aforementioned amount of movement in the X-axis direction (a change in the coordinate position in the X-axis direction) and the amount of deviation adjustment in the Y-axis direction (a change in the coordinate position in the Y-axis direction), the control means 40 calculates an angular difference between the first channel CH1 and the X-axis direction. The table control section 42 then drives and controls the θ table 13 so as to rotate the holding table 11 by the calculated amount of angular difference in the direction of eliminating the angular difference.

When θ adjustment is made in the low-magnification mode as described above, the degree of coincidence between the orientation of the first channel CH1 (first direction D1) and the X-axis direction becomes higher than at the stage of coarse positioning (FIG. 2). Subsequently, the imaging means 15 is set at a high magnification to capture an image of the target 25 on the wafer 20 for the purpose of making more accurate θ adjustment (this θ adjustment is hereinafter referred to as the θ adjustment in a high-magnification mode).

As is the case with θ adjustment in the low-magnification mode, θ adjustment in the high-magnification mode can be made by allowing the operator to operate the arrow keys 33 and 34 on the operation panel 30 until the center of the reference mark 32 coincides with a straight line on the target 25. However, operating the arrow keys 33 and 34 to accurately position the reference mark 32 on a desired straight line is time-consuming and requires skills. The cutting apparatus 10 according to the present embodiment is able to easily and surely perform θ adjustment in a different mode that is executed by operating the mode selection button 35. Details are described below.

When the mode selection button 35 is operated, the control means 40 first performs a first region imaging step. In the first region imaging step, the imaging means 15 captures an image of a first region EA (see FIG. 2) on the wafer 20 at a high magnification. The first region EA is a region including the first target 25A existing in a predetermined device 22A that is positioned at one end (the left end in FIG. 2) in the first direction D1.

Subsequently, the control means 40 performs a first region straight line storage step. In the first region straight line storage step, the image processing section 43 performs image processing to detect the coordinate positions of all straight lines that are included in the first region EA imaged at the high magnification and positioned within a predetermined angle from the X-axis (an allowable angular difference from the X-axis), and stores the detected coordinate positions in the storage section 46 as individual straight line data including coordinates. Due to earlier-described coarse positioning and low-magnification mode θ adjustment of the wafer 20, the first channel CH1 extended in the first direction D1 is positioned within the predetermined angle from the X-axis (an allowable angular difference from the X-axis). Accordingly, linear portions that are within the first target 25A included in the first region EA and parallel to the first channel CH1 (a portion of the target 25 in FIG. 4 that is marked by a thick line) is also within the predetermined angle from the X-axis (an allowable angular difference from the X-axis).

If, in the first region straight line storage step, no straight line having an allowable angular difference from the X-axis is detected in the first region EA, a possible cause is that the region imaged by the imaging means 15 is outside the first region EA including the first target 25A or the first channel CH1 is excessively inclined from the X-axis due to improper coarse positioning and low-magnification mode θ adjustment of the wafer 20. In such an instance, the control means 40 should, for example, display a warning on the operation panel 30 and prompt the operator to set an imaging region again and confirm the rotational position of the wafer 20.

FIG. 4 illustrates a state where an image of the first target 25A in the first region EA, which is captured in the first region imaging step, is displayed in the image display region 31 of the operation panel 30. In the image display region 31, the left-right direction corresponds to the X-axis direction, and the up-down direction corresponds to the Y-axis direction. A plurality of linear edges that are included in the first target 25A and marked by a thick line in FIG. 4 are the linear portions that are detected and stored in the first region straight line storage step. More specifically, six lateral portions of each bar-shaped portion 26 exhibiting a longitudinal direction in parallel with the first channel CH1 (a total of 12 portions of the two bar-shaped portion 26) and two longitudinal ends of each bar-shaped portion 27 orthogonal to each bar-shaped portion 26 (a total of four portions of the two bar-shaped portions 27), that is, a total of 16 portions, are detected as the linear portions. The above-described straight line detection can be achieved by outline extraction based on a well-known digital image analysis method that uses, for example, a Sobel filter.

Upon completion of the first region straight line storage step, the control means 40 updates the information displayed in the image display region 31 so that the operator is able to identify each of the straight lines detected and stored in the first region straight line storage step. Some display methods for highlighting the straight lines are selectable. More specifically, the straight lines may be highlighted, for example, by coloring the linear portions, changing the brightness of the linear portions, or changing the widths of the displayed linear portions (e.g., accentuating the straight lines by using a thick line as indicated in FIG. 4). This type of display control is provided by processing performed in the display control section 44.

In the subsequent first straight line registration step, the operator operating the cutting apparatus 10 selects a desired straight line within the first target 25A from all straight lines stored in the first region straight line storage step (including the 16 linear portions marked by a thick line in FIG. 4), and registers the selected straight line as a first straight line T1 (FIG. 4).

In the configuration depicted in FIG. 4, the operator selects the first straight line T1 by touching the operation panel (the image of the first target 25A displayed in the image display region 31) with a finger. When the selection is made by the operator, the control means 40 recognizes the coordinate position of the image touched by the finger of the operator, and selects, as the first straight line T1, a stored straight line at a coordinate position that is at the shortest distance from the recognized coordinate position. The distance between each straight line and a position touched by the finger of the operator is calculated by conversion from the number of display pixels in the image display region 31. Therefore, even if the position of the image touched by the finger of the operator does not coincide with the position of a straight line of the first target 25A or the operation accuracy or detection accuracy of the operation panel 30 is limited, the first straight line T1 can be selected easily and surely by merely performing a coarse operation.

In the configuration depicted in FIG. 4, an upper central linear portion of the upper one of the two bar-shaped portions 26 is selected as the first straight line T1. In this instance, even if the operator touches a position that is slightly deviated in the Y-axis direction from the first straight line T1, in a case where the stored straight line positioned closest to the touched position is the first straight line T1, the control means 40 recognizes the first straight line T1 as the selected linear portion, and performs input processing on the assumption that the first straight line T1 is selected. A selection signal indicative of the first straight line T1 is then inputted to the input processing section 45 for selection and registration purposes.

When the first straight line T1 is selected and registered, the control means 40 moves and positions the imaging means 15 as depicted in FIG. 5 so that the coordinate position of the first straight line T1 selected by the operator coincides with the center of the reference mark 32. The operation panel 30 then clearly identifies the selected first straight line T1 from among a plurality of straight lines included in the first target 25A. This prevents an unintended straight line from being selected against the intention of the operator. If any undesired straight line is selected, selection information concerning a straight line is updated when the operation panel 30 is touched to select another straight line. Further, the selection of a straight line can be reset by operating the cancel button 38 on the operation panel 30.

When the operator performs an applying procedure (e.g., turns on the apply button 37 on the operation panel 30) after the selection of the first straight line T1, the selection and registration of the first straight line T1 in the first straight line registration step is completed. The position coordinates (X1, Y1) of the registered first straight line T1 are then detected and stored in the storage section 46.

Next, as depicted in FIG. 2, the imaging means 15 relatively moves a predetermined distance L (mm) in the X-axis direction with respect to the wafer 20 in order to perform the second region imaging step. In the second region imaging step, the imaging means 15 captures a high-magnification image of a second region EB (see FIG. 2) of the wafer 20. The second region EB is a region including the second target 25B, which exists in a device 22B that is positioned at an opposing end (the rightmost end in FIG. 2) in the first direction D1 with respect to the device 22A imaged in the earlier-described first region imaging step. The interval between the first target 25A and second target 25B in the first direction D1 of the wafer 20 is predetermined as a default value. The predetermined distance L in the X-axis direction is determined based on the default value. As the earlier-described coarse positioning and low-magnification mode θ adjustment of the wafer 20 are completed, the interval between the first target 25A and second target 25B in the first direction D1 is approximate in direction and length to the predetermined distance L in the X-axis direction. Therefore, when the imaging means 15 is relatively moved the predetermined distance L with respect to the wafer 20, the second target 25B is within a high-magnification imaging field of view of the imaging means 15.

Next, the second region straight line storage step is performed. In the second region straight line storage step, the coordinate positions of all straight lines that are included in the second region EB imaged at the high magnification and are positioned within a predetermined angle from the X-axis (an allowable angular difference from the X-axis) are detected by performing image processing and stored in the storage section 46. Straight line detection and storage in the second region straight line storage step are performed in the same manner as in the earlier-described first region straight line storage step, and a plurality of linear portions (16 portions) that are within the second target 25B and marked by a thick line in FIG. 4 are to be detected.

As is the case with the first region straight line storage step, if, in the second region straight line storage step, no straight line having an allowable angular difference from the X-axis is detected in the second region EB, it is probably due to an error in imaging region setup or coarse positioning and low-magnification mode θ adjustment. In such an instance, for example, a warning should be displayed on the operation panel 30 to report the error to the operator.

Upon completion of the second region straight line storage step, the control means 40 updates the information displayed in the image display region 31 so that the straight lines stored in the second region straight line storage step are highlighted in the image display region 31. The straight lines may be highlighted, for example, by coloring the linear portions, changing the brightness of the linear portions, or changing the widths of the displayed straight lines (see FIG. 4).

Next, a second straight line registration step is performed. From all straight lines (see FIG. 4) in the second target 25B that are stored in the second region straight line storage step, the operator of the cutting apparatus 10 selects, as a second straight line T2, a straight line corresponding to (in the same positional relationship as) the first straight line T1 within the first target 25A that is selected and registered in the first straight line registration step. That is, as depicted in FIG. 4, the operator of the cutting apparatus 10 selects an upper central linear portion of the upper one of the two bar-shaped portions 26 as the second straight line T2.

As is the case with the earlier-described selection of the first straight line T1, the selection of the second straight line T2 can be made by allowing the operator to touch the operation panel 30. Even if the position of an image portion touched by the finger of the operator does not perfectly coincide with a straight line in the second target 25B, a straight line positioned closest to a coordinate position touched by the finger is recognized as the selected second straight line T2. Therefore, even when the operation accuracy or detection accuracy of the operation panel 30 is limited, the second straight line T2 can be selected easily and surely by merely performing a coarse operation.

When the selection of the second straight line T2 is inputted, as depicted in FIG. 5, the control means 40 updates the information displayed in the image display region 31 of the operation panel 30 and performs positioning so that the coordinate position of the second straight line T2 selected by the operator coincides with the center of the reference mark 32. The operation panel 30 then clearly identifies the position selected as the second straight line T2. This prevents an unintended straight line from being selected against the intention of the operator.

When the operator performs an applying procedure (e.g., turns on the apply button 37 on the operation panel 30) after the selection of the second straight line T2, the selection and registration of the second straight line T2 in the second straight line registration step is completed. The position coordinates (X2, Y2) of the registered second straight line T2 are then detected and stored in the storage section 46.

After completion of the second straight line registration step, an orientation adjustment step is performed. In the orientation adjustment step, from the difference ΔY between the position in the Y-axis direction of the first straight line (coordinate Y1) and the position in the Y-axis direction of the second straight line (coordinate Y2) and the aforementioned predetermined distance L in the X-axis direction (see FIG. 2), the control means 40 calculates an angular difference θ=arctan(ΔY/L) between the first channel CH1 (first direction D1) of a street 21 and the processing feed direction (X-axis direction) (see FIG. 2). Then, as indicated by the arrow R in FIG. 2, the table control section 42 drives and controls the θ table 13 so as to rotate the holding table 11 θ degrees and adjust the orientation of the first channel CH1 (first direction D1) until it is parallel to the processing feed direction (X-axis direction).

When the foregoing steps are performed, θ adjustment concerning the first channel CH1 of the street 21 is completed. After completion of θ adjustment, a positioning step is performed to position the cutting blade 12 on the first channel CH1 for cutting work. The positioning step according to the present embodiment provides manual alignment in which the operator of the cutting apparatus 10 achieves positioning in the X- and Y-axis directions while viewing an object image (an image of a predetermined portion of the wafer 20) in the image display region 31 of the operation panel 30. The cutting blade 12 is properly positioned when, for example, a line in the X-axis direction that passes through the center of the reference mark 32 is positioned to coincide with the first channel CH1 to be initially cut. When the operator performs an applying procedure (e.g., turns on the apply button 37 on the operation panel 30) after positioning, the alignment of the first channel CH1 terminates.

When the alignment of the first channel CH1 is terminated, the control means 40 drives and controls the θ table 13 through the table control section 42 in such a manner as to rotate the holding table 11 90 degrees. Then, θ adjustment and alignment concerning the second channel CH2 of a street 21 are performed. Methods of θ adjustment and alignment concerning the second channel CH2 are similar to the earlier-described methods of θ adjustment and alignment concerning the first channel CH1, and thus will be briefly described.

Low-magnification mode θ adjustment concerning the second channel CH2 is the same as the earlier-described θ adjustment except that the second channel CH2 is used as the reference instead of the first channel CH1.

The target 25 formed on each device 22 of the wafer 20 includes a plurality of linear portions parallel to the second channel CH2 (linear portions marked by thin lines in FIGS. 4 to 6). Therefore, these linear portions in the target 25 can be used as the first and second straight lines for high-magnification mode θ adjustment. More specifically, in the high-magnification mode θ adjustment concerning the second channel CH2, reference is made to the first target 25C and second target 25D (see FIG. 2) existing respectively in a device 22C and a device 22D (see FIG. 2) that are located in different positions in the second direction D2 (in a direction in which the second channel CH2 is extended).

In the high-magnification mode θ adjustment, the imaging means 15 captures a high-magnification image of a first region EC (see FIG. 2) including the first target 25C (first region imaging step), and stores all linear portions having an allowable angular difference from the X-axis (linear portions of the target 25 that are marked by thin lines in FIGS. 4 to 6) in the storage section 46 (first region straight line storage step). The operator makes reference to the first target 25C displayed in the image display region 31, selects a particular first straight line from the stored linear portions, and registers the selected first straight line (first straight line registration step).

Next, the imaging means 15 moves a predetermined amount in the X-axis direction, captures a high-magnification image of a second region ED (see FIG. 2) including the second target 25D (second region imaging step), and stores all linear portions having an allowable angular difference from the X-axis (linear portions of the target 25 that are marked by thin lines in FIGS. 4 to 6) in the storage section 46 (second region straight line storage step). The operator makes reference to the second target 25D displayed in the image display region 31, and selects and registers a second straight line that is in a position corresponding to the position of the first straight line registered in the first straight line registration step (second straight line registration step).

Upon completion of the second straight line registration step, the control means 40 performs the orientation adjustment step in order to adjust the orientation of the second channel CH2 (second direction D2) until it is parallel to the processing feed direction (X-axis direction). θ adjustment concerning the second channel CH2 is now completed. Subsequently, the positioning step is performed. In the positioning step, while viewing an image displayed in the image display region 31, the operator manually positions the cutting blade 12 on the second channel CH2 to be initially cut.

When the operator operates the operation panel 30 to issue a command for executing cutting work after completion of alignment including the above-described θ adjustment, cutting work is performed along the streets 21. Cutting work is performed automatically by the control of the control means 40. A selection can be made to specify which of the first channels CH1 and second channels CH2 of the streets 21 is to be initially cut. For example, when θ adjustment and alignment are performed in order from the first channels CH1 to the second channels CH2 as described above, the second direction D2 in which the second channels CH2 are extended coincides with the X-axis direction (processing feed direction). Therefore, the time loss is relatively small when the second channels CH2 are cut prior to the first channels CH1.

When the second channels CH2 are to be cut prior to the first channels CH1, the cutting blade 12 is lowered in the Z-axis direction to a predetermined cutting depth while it is being rotationally driven, and the holding table 11 and the cutting blade 12 are relatively moved in the X-axis direction to perform cutting along one second channel CH2. Subsequently, the cutting blade 12 is raised, and then the holding table 11 and the cutting blade 12 are relatively moved in the Y-axis direction (index-fed) to position the cutting blade 12 above an uncut second channel CH2 that is to be cut next. Cutting work is then similarly performed on the uncut second channel CH2.

When cutting work is completed on all the second channels CH2, switching is made to cutting work on the first channels CH1. The holding table 11 (θ table 13) is rotated 90 degrees so that the first direction D1 in which the first channels CH are extended is oriented in the X-axis direction. The cutting blade 12 is then processing-fed in the X-axis direction to perform cutting work on each first channel CH1.

FIG. 6 illustrates variations of the first and second straight line registration steps for θ adjustment of the wafer 20. In the earlier-described configuration depicted in FIG. 4, the first straight line T1 and the second straight line T2 are selected when the operator touches an image of the target 25 (first target 25A and second target 25B) displayed on the operation panel 30. More specifically, the control means 40 performs processing so that a stored straight line closest to a coordinate position of the operation panel 30 that is touched by the operator is recognized as the first straight line T1 or the second straight line T2. Meanwhile, in the configuration depicted in FIG. 6, identification data indicative of specific information about each straight line is given to a plurality of linear portions within the target 25 (first target 25A and second target 25B) that are stored in the first region straight line storage step and the second region straight line storage step, and thus the operator of the cutting apparatus 10 makes reference to the identification data and selects a straight line. In the configuration depicted in FIG. 6, numbering is performed so that a number is used as the identification data and assigned to each straight line. The operator inputs, as selection information, a number corresponding to the linear portion to be selected.

More specifically, as mentioned earlier, the grid-shaped target 25 includes a total of 16 linear portions that are to be detected and stored in the first and second region straight line storage steps. The display control section 44 of the control means 40 displays information on the operation panel 30 while the numbers 1 to 16 are laid over the 16 liner portions (see FIG. 6). The operator of the cutting apparatus 10 inputs, in a number input section 48 in an input area 47 of the operation panel 30, the number of the linear portion to be selected as the first straight line T1 or the second straight line T2 (the number 3 is selected in FIG. 6). The number can be inputted through a keyboard (not depicted) or by touching a number displayed on a pull-down menu of the number input section 48. When the apply button 37 on the operation panel 30 is operated after the number is inputted, the linear portion numbered 3 is selected and registered as the first straight line T1 or the second straight line T2.

In the configuration depicted in FIG. 6, the first straight line or the second straight line is selected by inputting the number assigned to a straight line. Therefore, the operator can select a straight line in a clearer, easier-to-remember manner than when selecting the straight line by using imaged positional information alone. Further, when selecting a straight line, the operator need not touch the image of the target 25 within the image display region 31. Therefore, the influence of the operation accuracy of the operation panel 30 is more unlikely. This makes it possible to build a simple operation system. Meanwhile, the configuration depicted in FIG. 4, in which a linear portion of the image of the target 25 is to be touched, has a visual appeal and is excellent in intuitiveness.

As regards the first straight line registration step and the second straight line registration step, the configurations depicted in FIGS. 4 and 6 have their own advantages as described above. Therefore, an appropriate configuration may be adopted depending on which advantage is highly valued. An alternative is to provide input modes for selecting the configuration depicted in FIG. 4 and selecting the configuration depicted in FIG. 6, and allow the operator to switch between the input modes as appropriate for the selection of a straight line.

Instead of numbers (numerals) depicted in FIG. 6, for example, characters, such as alphabetical characters, and symbols other than the characters may be used as the specific information to be given to the linear portions.

An embodiment applied to centering (center adjustment) will now be described with reference to FIGS. 7 and 8. Centering is performed to position the processing means at the widthwise center of a street 21 on the wafer 20. Centering is performed after earlier-described θ adjustment. That is, the first direction D1 (see FIG. 2), in which the first channels CH1 of the streets 21 are extended, and the second direction D2 (see FIG. 2), in which the second channels CH2 are extended, are already adjusted to coincide with the X-axis direction and the Y-axis direction.

When the mode selection button 36 is operated, the control means 40 performs an imaging step. A target to be imaged in the imaging step is a predetermined one of a plurality of streets 21 extended in the X-axis direction. With the position and magnification of the imaging means 15 set, imaging is performed so that the entire width in the Y-axis direction of the predetermined street 21 is within the imaging field of view (see FIG. 7).

Next, the control means 40 performs a straight line storage step. In the straight line storage step, image processing is performed in the image processing section 43 to detect the coordinate positions of all straight lines extended in the X-axis direction from a region imaged in the imaging step, and the detected coordinate positions are stored in the storage section 46 as individual straight line data including the coordinate positions. At a stage where center adjustment is made, adjustment is completed. Therefore, opposing ends of the street 21 extended in the X-axis direction, which are apart from each other in the Y-axis direction, correspond to a straight line that is to be detected and stored in the straight line storage step. In the example of FIG. 7, a straight line F1 and a straight line F2 are detected at outer portions of the opposing ends of the street 21, and a straight line F3 and a straight line F4 are detected at inner portions of the opposing ends of the street 21. Coordinate data concerning each of these straight lines is stored.

The display control section 44 then performs processing so as to update the information displayed in the image display region 31 and highlight each straight line stored in the straight line storage step so that each straight line can be identified (each straight line is highlighted, for example, by coloring it, changing its brightness, or changing its width). The straight lines F1, F2, F3, and F4 depicted in FIG. 7 are in a highlighted state.

In the example of FIG. 7, only the straight lines F1, F2, F3, and F4 indicative of the edges of the street 21 are detected and stored. However, if a linear portion extended in the X-axis direction within the imaging region exists at a portion other than the edges of the street 21, the associated straight line is also detected, stored, and highlighted in the straight line storage step.

Next, a straight line registration step is performed. In the straight line registration step, from all straight lines stored in the straight line storage step, the operator operating the cutting apparatus 10 selects two straight lines respectively indicating the opposing ends in the Y-axis direction of the street 21. In this instance, when a straight line (F1 or F2) at the outer portion of an edge is selected on one side of the street 21, a straight line (F2 or F1) at the outer portion of an edge is also selected on the other side of the street 21. Similarly, when a straight line (F3 or F4) at the inner portion of an edge is selected on one side of the street 21, a straight line (F4 or F3) at the inner portion of an edge is also selected on the other side of the street 21. That is, two straight lines symmetric in the Y-axis direction with respect to the center of the street 21 are selected. The selected two straight lines (F1 and F2 or F3 and F4) are then registered.

In the straight line registration step, straight lines may be selected and registered by allowing the operator to touch the operation panel 30 with an operator's finger or input, for example, a number, character, or symbol assigned to a straight line, as is the case with the earlier-described θ adjustment.

FIG. 7 illustrates a case where the operator selects a straight line by touching the operation panel 30. The control means 40 recognizes the coordinate position of an image portion firstly touched by the finger of the operator, and selects a stored straight line closest the recognized coordinate position as the first straight line. Next, the control means 40 recognizes the coordinate position of an image portion secondly touched by the finger of the operator, and selects a stored straight line closest the recognized coordinate position as the second straight line. When the operator performs an applying procedure (e.g., turns on the apply button 37 on the operation panel 30) after the selection of the second straight line, the selection and registration of each straight line in the straight line registration step is completed. The position coordinates of each registered straight line are then detected and stored in the storage section 46.

When the first and second straight lines corresponding to the opposing ends of a street 21 are to be selected, the control means 40 moves and positions the imaging means 15 so that the coordinate position of a selected straight line coincides with the center of the reference mark 32 (a line extended in the X-axis direction within the reference mark 32). Therefore, the selected straight lines can be clearly identified on the operation panel 30. If an unintended straight line is selected, the selection of such a straight line can be reset, for example, by operating the cancel button 38 on the operation panel 30.

As described above, in the straight line registration step, a straight line can be selected easily and surely from among the straight lines F1, F2, F3, and F4 stored in the storage section 46 by touching a straight line or the vicinity of the straight line. Therefore, the selection of a straight line is not time-consuming and can be made without operating the arrow keys 33 and 34 in a deliberate manner to align the straight line with the center of the reference mark 32. The same advantages are obtained even when the straight line registration step is performed in a configuration in which, for example, a number assigned to a straight line F1, F2, F3, F4 is inputted (a configuration depicted in FIG. 6).

When the selection and registration of the first and second straight lines is completed in the straight line registration step, a centerline G (FIG. 8) passing through the widthwise center of a street 21 is determined as a straight line that is located at a position equally distant from the coordinate positions in the Y-axis direction of the first and second straight lines (located at an intermediate position in the Y-axis direction) and extended in the X-axis direction. More specifically, if the number of display pixels in the Y-axis direction between the first and second straight lines within the image display region 31 is Pn, the control means 40 sets the centerline G as a straight line passing through a position that is equally distant from the first and second straight lines by Pn/2. As depicted in FIG. 8, the control means 40 moves the imaging means 15 in accordance with the coordinate data concerning the selected two straight lines so that the centerline G of the street 21 passes through the center of the reference mark 32.

The relative positional relationship between the imaging means 15 and the cutting blade 12 is predetermined. Therefore, the cutting blade 12 is positioned on the centerline G of the street 21 by relatively moving the imaging means 15 and the wafer 20 from a state depicted in FIG. 8 in accordance with the coordinate data concerning both the imaging means 15 and the cutting blade 12. That is, the positioning step is completed.

As described above, the workpiece positioning method according to the present embodiment performs image processing to detect and store the coordinate positions of all straight lines that exist within a region imaged by the imaging means 15 and satisfy predetermined conditions (straight lines positioned within a predetermined angle from the X-axis direction (within an allowable limit) in the case of θ adjustment or straight lines extended in the X-axis direction in the case of street centering). Accordingly, the operator is able to easily and surely complete the registration of a straight line used as a target for θ adjustment or street centering merely by selecting a desired straight line from the stored straight lines and without performing delicate cursor work on the operation panel 30. This results in an increase in the throughput of alignment operations.

Further, the information displayed on the operation panel 30 is updated as depicted in FIG. 5 in response to an operator's selection of a straight line. This improves the identifiability of a selected straight line and reduces the possibility of an erroneous operation for the registration of a straight line.

The first and second straight lines registered in the first and second straight line registration steps, which are performed for θ adjustment, are such that the amount of positional deviation in the Y-axis direction increases with an increase in the distance in the X-axis direction between the first and second straight lines. That is, the accuracy of coordinate position detection increases to reduce the possibility of error in angular difference calculation in the orientation adjustment step. Therefore, the first and second region imaging steps for θ adjustment according to the foregoing embodiments capture the images of the targets 25A and 25B within the devices 22A and 22B, which are most distant from each other in the first direction D1, and the images of the targets 25C and 25D within the devices 22C and 22D, which are most distant from each other in the second direction D2. However, in contrast to the foregoing embodiments, a target 25 within a device 22 positioned at a location other than the opposing ends of the first direction D1 and second direction D2 can be selected as an imaging target.

The first and second straight line registration steps for θ adjustment can be performed by using various characteristic patterns that are formed by elements and wires included in a device on a workpiece and provided with predetermined straight lines. For example, a grid-shaped target 25 is used for θ adjustment according to the foregoing embodiments. However, the shape and configuration of an index used for θ adjustment are not limited to those of the grid-shaped target 25.

Further, a technology for facilitating the selection of a straight line in an captured image as described in conjunction with the foregoing embodiments is also effective in a teach mode. The teach mode is a mode in which an alignment mark (image) and street information serving as a reference necessary for alignment processing are registered in the processing apparatus. The teach mode makes it possible to store the shape of a target and the distance from the target to a street in the processing apparatus. Operations in the teach mode are manually performed while the operator is viewing an image captured by the imaging means. Therefore, operability improvement for the selection of a straight line here is effective.

Before high-magnification mode θ adjustment with the imaging means 15, the foregoing embodiments perform coarse positioning by using the holding table 11 (positioning pins 53) and the frame 50 (cut-outs 52), and make low-magnification mode θ adjustment by using the imaging means 15. However, θ adjustment may alternatively be made in a different configuration. For example, in contrast to the foregoing embodiments, coarse positioning may be performed by using, for example, an orientation flat formed on a wafer. The present invention is applicable not only to a cutting apparatus described, for example, in conjunction with the foregoing embodiments, but also widely applicable to processing apparatuses that require the positioning of processing means with respect to a street.

Further, for example, the material of the workpiece and the type of device formed on the workpiece are not limited. For example, various workpieces may be used, including semiconductor device wafers, optical device wafers, package substrates, semiconductor substrates, inorganic material substrates, oxide wafers, raw ceramic substrates, and piezoelectric substrates. A silicon wafer or compound semiconductor wafer on which devices are formed may be used as a semiconductor device wafer. A sapphire wafer or silicon carbide wafer on which devices are formed may be used as an optical device wafer. A chip size package (CSP) substrate may be used as a package substrate. As a semiconductor substrate, for example, silicon or gallium arsenide may be used. As an inorganic material substrate, for example, sapphire, ceramic, or glass may be used. As an oxide wafer, lithium tantalate or lithium niobate may be used no matter whether or not devices are already formed on it.

Furthermore, embodiments of the present invention are not limited to the foregoing embodiments and exemplary modifications, and may be variously changed, replaced, or modified without departing from the technical idea of the present invention. Moreover, if the technical idea of the present invention can be implemented by a different method based on newly advanced or derived technologies, such a method may be used to implement the present invention. Consequently, the scope of the claim of the present invention covers all possible embodiments that may be included within the scope of the technical idea of the present invention.

As described above, the positioning method according to the embodiments of the present invention provides improved operability during θ adjustment of a workpiece and centering of a street for alignment purposes, and contributes toward an increase in the use efficiency of a processing apparatus that processes the workpiece along the street.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A positioning method for positioning processing means with respect to a plurality of streets before holding a workpiece with a rotatable holding table and allowing the processing means to perform processing feed of the workpiece in an X-axis direction along the streets, the workpiece having a plurality of surface-mounted devices formed in a region divided by the streets arrayed in a first direction and in a second direction, the second direction being orthogonal to the first direction, the positioning method comprising:

an imaging step of using imaging means to capture an image of a region including an operator-selected target or street among the plurality of streets on the workpiece;

a straight line storage step of, after completion of the imaging step, performing image processing to detect and store coordinate positions of all predetermined straight lines formed on an upper surface of a device among the plurality of devices and/or the street in the region;

a straight line registration step of, after completion of the straight line storage step, allowing the operator to select a specific straight line in the target or on the street from all the straight lines and register the selected straight line; and a positioning step of positioning the processing means with respect to the street in accordance with coordinate data concerning the straight line selected and registered in the straight line registration step.

2. The positioning method according to claim 1, wherein the imaging step, the straight line storage step, and the straight line registration step include a first region imaging step of capturing an image of a first region including a first target that is selected by the operator with the imaging means, a first region straight line storage step of performing image processing to detect and store coordinate positions of all straight lines that are formed on the upper surface of the device and/or the street in the first region and have an allowable angular difference from an X-axis, a first straight line registration step of, after completion of the first region straight line storage step, allowing the operator to select a straight line in the first target from all the straight lines and register the selected straight line as a first straight line, a second region imaging step of, after completion of the first straight line registration step, moving the imaging means by a predetermined distance L (mm) in a processing feed direction from the first region and capturing an image of a second region including a second target identical with the first target, a second region straight line storage step of performing image processing to detect and store coordinate positions of all straight lines that are formed on the upper surface of the device and/or the street in the second region and have an allowable angular difference from the X-axis, and a second straight line registration step of, after completion of the second region straight line storage step, allowing the operator to select a straight line in the second target from all the straight lines and register the selected straight line as a second straight line, the positioning method further includes an orientation adjustment step of, after completion of the second straight line registration step, calculating an angular difference $\theta=\arctan(\Delta Y/L)$ between the street and the processing feed direction from the difference $\Delta Y$ between a Y-axis direction position of the first straight line and a Y-axis direction position of the second straight line and from the predetermined distance L, and rotating the holding table $\theta$ degrees until the orientation of the street is parallel to the processing feed direction, and the positioning step is performed after completion of the orientation adjustment step.

3. The positioning method according to claim 2, wherein the first straight line registration step and the second straight line registration step are such that the coordinate position of the straight line selected from all the straight lines by the operator is relatively set as a reference position of the imaging means.

4. The positioning method according to claim 1, wherein the imaging step captures an image of a region including the entire width in a Y-axis direction of the street extended in the X-axis direction, the straight line storage step detects and stores all straight lines extended in the X-axis direction within the region imaged in the imaging step, the straight line registration step allows the operator to select two straight lines indicative of opposing ends in the Y-axis direction of the street from all the straight lines and register the selected two straight lines, and the positioning step positions the processing means at an intermediate position in the Y-axis direction of the two straight lines selected and registered in the straight line registration step.

* * * * *